US010446414B2

(12) United States Patent
Nangia et al.

(10) Patent No.: US 10,446,414 B2
(45) Date of Patent: Oct. 15, 2019

(54) SEMICONDUCTOR PACKAGE WITH FILLER PARTICLES IN A MOLD COMPOUND

(71) Applicant: TEXAS INSTRUMENTS INCORPORATED, Dallas, TX (US)

(72) Inventors: Amit Sureshkumar Nangia, Murphy, TX (US); Siva Prakash Gurrum, Allen, TX (US); Janakiraman Seetharaman, Bengaluru (IN)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 15/853,345

(22) Filed: Dec. 22, 2017

(65) Prior Publication Data
US 2019/0198352 A1 Jun. 27, 2019

(51) Int. Cl.
| | |
|---|---|
| *H01L 21/56* | (2006.01) |
| *H01L 23/29* | (2006.01) |
| *H01L 23/495* | (2006.01) |
| *C08G 59/18* | (2006.01) |
| *H01L 23/64* | (2006.01) |
| *H01L 23/522* | (2006.01) |
| *H01L 23/00* | (2006.01) |
| *H01L 23/50* | (2006.01) |

(52) U.S. Cl.
CPC ............ *H01L 21/565* (2013.01); *C08G 59/18* (2013.01); *H01L 23/295* (2013.01); *H01L 23/495* (2013.01); *H01L 23/50* (2013.01); *H01L 23/5223* (2013.01); *H01L 23/642* (2013.01); *H01L 24/03* (2013.01)

(58) Field of Classification Search
CPC ....... H01L 21/565; H01L 23/50; H01L 24/03; H01L 23/495; H01L 23/295; H01L 23/642; C08G 58/18
See application file for complete search history.

(56) References Cited

U.S. PATENT DOCUMENTS

| | | | | |
|---|---|---|---|---|
| 4,617,708 A | * | 10/1986 | Fanning | ............ H01L 23/49589 |
| | | | | 257/E23.057 |
| 6,321,734 B1 | * | 11/2001 | Kaminaga | ............. H01L 21/563 |
| | | | | 123/634 |
| 7,435,625 B2 | * | 10/2008 | Condie | ................. H01L 23/295 |
| | | | | 174/522 |

(Continued)

OTHER PUBLICATIONS

Arimoto Kazutami, et al. "An Effect of Filler-Induced Stress on DRAM Sense Amplifiers." IEEE Transactions on Electron Devices, vol. ED-34, No. Feb. 2, 1987.

(Continued)

*Primary Examiner* — William Coleman
(74) *Attorney, Agent, or Firm* — Dawn Jos; Charles A. Brill; Frank D. Cimino

(57) ABSTRACT

A semiconductor package includes an integrated circuit formed on a semiconductor substrate. A stress buffer layer is provided on the integrated circuit. Further, a mold compound is provided on a surface of the stress buffer layer opposite the integrated circuit. The mold compound comprises a resin. The resin includes filler particles. The filler particles have multiple sizes with the largest of the particles having a size between 5 microns and 32 microns.

19 Claims, 3 Drawing Sheets

FIG. 1

(56) References Cited

U.S. PATENT DOCUMENTS

| | | | | |
|---|---|---|---|---|
| 8,233,261 | B2* | 7/2012 | Summers | H01G 4/224 |
| | | | | 361/301.3 |
| 8,344,487 | B2* | 1/2013 | Zhang | H01L 23/3107 |
| | | | | 257/669 |
| 8,786,105 | B1* | 7/2014 | Meyer | H01L 24/19 |
| | | | | 257/737 |
| 9,035,473 | B2* | 5/2015 | Nakazato | H01L 21/561 |
| | | | | 257/795 |
| 2008/0237855 | A1* | 10/2008 | Fan | H01L 23/13 |
| | | | | 257/738 |
| 2015/0037938 | A1* | 2/2015 | Zhang | H01L 21/56 |
| | | | | 438/123 |
| 2016/0084887 | A1* | 3/2016 | Beer | G01R 15/146 |
| | | | | 324/126 |
| 2017/0133309 | A1* | 5/2017 | Kim | H01L 23/5389 |
| 2017/0162500 | A1* | 6/2017 | Lee | H01L 23/49816 |
| 2018/0233422 | A1* | 8/2018 | Gurrum | H01L 23/4952 |

OTHER PUBLICATIONS

Hiatham Elbishari, et al. "Effect of Filler Size and Temperature on Packing Sress and Viscosity of Resin-Composites." Int. J. Mol. Sci. 2011, 12, 5330-5338. ISSN 1422-0067.

* cited by examiner

SEMICONDUCTOR PACKAGE WITH FILLER PARTICLES IN A MOLD COMPOUND

BACKGROUND

Many semiconductor devices are fabricated as a semiconductor die residing within a package. The package material includes a mold compound which provides mechanical support for and protects the integrated circuit formed on the semiconductor die. Some high precision analog devices (e.g., data converters, amplifiers, voltage or current references, sensors, etc.) may suffer a reduction in the precision of various parametrics as a result of packaging the die, reliability stresses, surface mounting the die, etc. Such reduction in precision may manifest itself as an increase in parametric distributions (e.g., distributions of offset voltages, reference voltages, etc.) which, in turn limits how narrowly certain parameters can be specified for the device.

SUMMARY

In accordance with the disclosed embodiments, during the packaging operation a mold compound is used that includes filler particles having a maximum size in the range of 5 microns to 50 microns. In some embodiments, the maximum size of the filler particles ranges from 5 microns to 32 microns.

In one embodiment, a semiconductor package includes an integrated circuit formed on a semiconductor substrate. A stress buffer layer is provided on the integrated circuit. Further, a mold compound is provided on a surface of the stress buffer layer opposite the integrated circuit. The mold compound comprises a resin. The resin includes filler particles. The filler particles have multiple sizes with the largest of the particles having a size between 5 microns and 32 microns.

BRIEF DESCRIPTION OF THE DRAWINGS

For a detailed description of various examples, reference will now be made to the accompanying drawings in which.

DETAILED DESCRIPTION

Stresses from packaging can impact performance of components on a semiconductor substrate, such as transistors, resistors, and capacitors. It has been determined that a source of the problem has to do with the size of filler particles that comprise the mold compound used during the packaging process of the semiconductor substrate. The disclosed embodiments address the aforementioned problem by limiting the maximum size of the filler particles.

Figure 1:
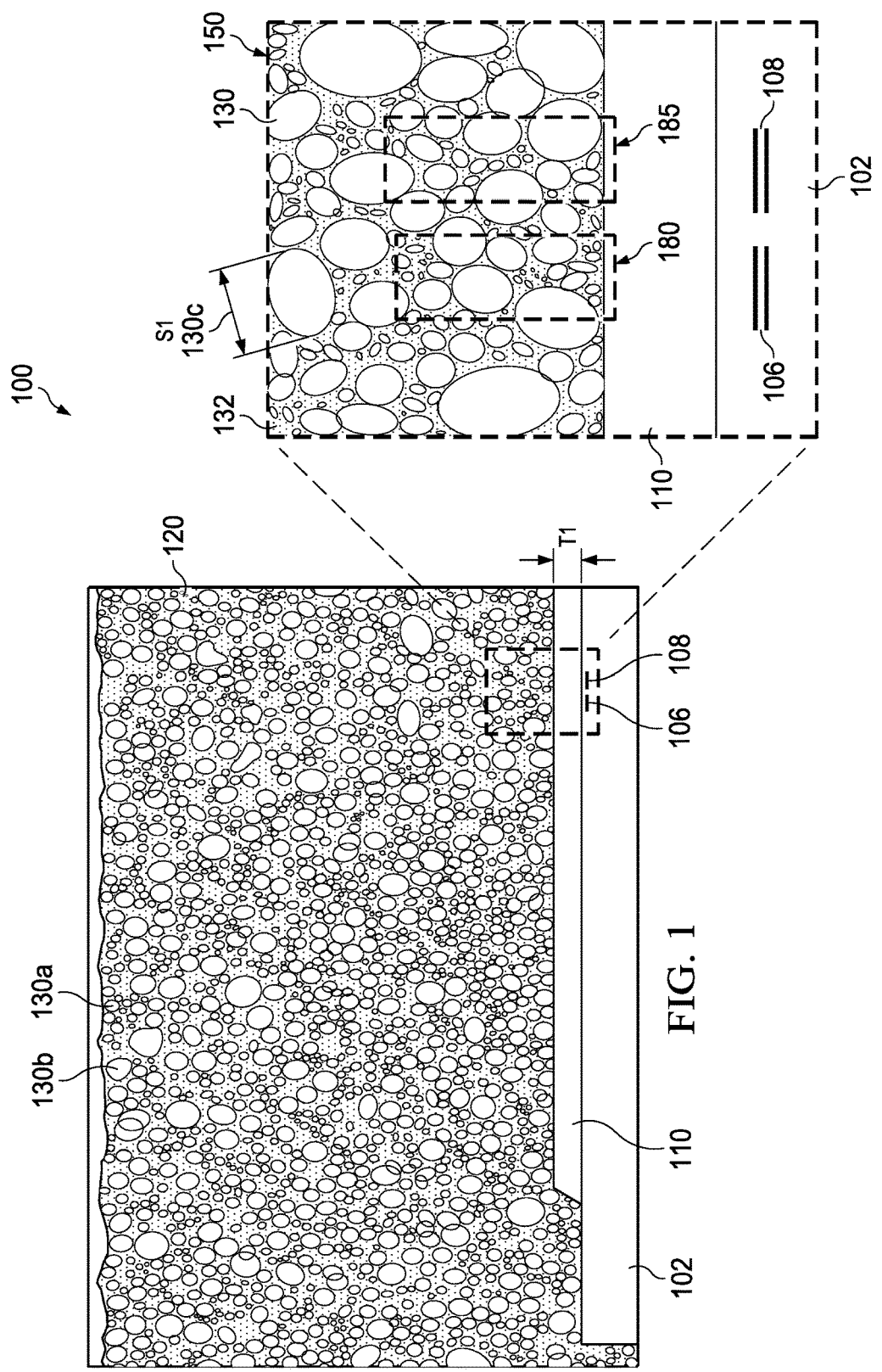
FIG. 1 illustrates a semiconductor package comprising a mold compound in which the largest size of the filler particles is between 5 micrometers (microns) and 50 micrometers (or 5-32 microns).

FIG. 1 illustrates a portion of a cross section of a semiconductor package 100 in accordance with an embodiment. In this example, the semiconductor package 100 includes a semiconductor substrate 102 on which an integrated circuit is formed, a stress buffer layer 110, and a mold compound 120. The integrated circuit in this example includes capacitors 106 and 108, but may include different or additional components as well. The stress buffer layer 110 is provided on the integrated circuit, and the mold compound 120 is provided on a surface of the stress buffer layer 110 opposite the integrated circuit, and also is on portions of the semiconductor substrate 102. The integrated circuit formed on the semiconductor substrate may perform any of a variety of functions. For example, the integrated circuit may comprise a voltage reference, a current reference, a sensor, a data converter (such as an analog-to-digital converter), an amplifier, or any other type of circuit.

The stress buffer layer 110 may comprise polyimide, a silicone-based material, or other suitable material to reduce mold compound-induced stress on the integrated circuit. The stress buffer layer 110 reduces the variations in stress due to filler particles in the mold compound 120 on the semiconductor substrate 102. The stress buffer layer has a thickness designated as T1 in FIG. 1. In some embodiments, the thickness of the stress buffer layer 110 is in the range of 1 micrometer (micron) to 50 microns, but can be smaller or larger in other embodiments. The stress buffer layer 110 can be applied at the wafer level prior to assembly, or at a singulated die level during assembly.

The mold compound 120 includes a resin 132 (e.g., a polymer resin), and the resin 132 includes filler particles 130 (see blow up image 150 of a portion of the semiconductor package 100). Two filler particles have been identified in FIG. 1 as filler particles 130a and 130b. The filler particles in the mold compound are collectively referred to herein as filler particles 130. The filler particles 130 may comprise silica ($SiO_2$), alumina ($Al_2O_3$), or other suitable material. The mold compound 120 is applied to singulated die.

As can be seen in the example of FIG. 1, the filler particles 130 in the mold compound 120 have multiple sizes. That is, some filler particles 130 are larger than other filler particles. For example, filler particle 130b is larger than filler particle 130a. While some filler particles 130 may have a shape that is spherical, or nearly spherical, the filler particles 130 may comprise various shapes, both geometric shapes and non-geometric shapes.

Reference is made herein to the "size" of the filler particles 130. In the example in which a filler particle 130 is spherical, the size of that particular filler particle is the diameter of the sphere. In examples in which a filler particle 130 is non-spherical and has a non-geometric shape, the size may refer to the largest distance between opposite surfaces of the filler particle. In the blow-up view 150, filler particle 130c is shown to have a size S1 which represents the largest distance across the filler particle.

It has been determined that that filler particles 130 and the resin 132 in which the filler particles 130 reside have different coefficient of thermal expansion (CTE) and moduli (the measure of the ability of a material to withstand changes in length when under lengthwise tension or compression). Because the resin 132 and the filler particles 130 have substantially different values for CTE and modulus, a semiconductor package can experience local stress variations across the semiconductor substrate (die) due to temperature changes. Larger filler particles induce higher stress gradients on the semiconductor substrate. For example, FIG. 1 illustrates a pair of capacitors 106 and 108 which, as noted above, may be part of an integrated circuit formed on the semiconductor substrate 102. Such capacitors may be used in, for example, a successive approximation register analog-to-digital converter (SAR ADC). To improve the precision and accuracy of the SAR ADC, the capacitors 106 and 108 are matched (e.g., same capacitance value). The mismatch of the capacitors should not deviate more than a threshold amount without impacting the precision of the SAR ADC. However, the local stresses caused by the mold compound if the mold compound contains filler particles greater than 50 microns in size can detrimentally impact how closely the capacitors remain matched.

Figure 2:
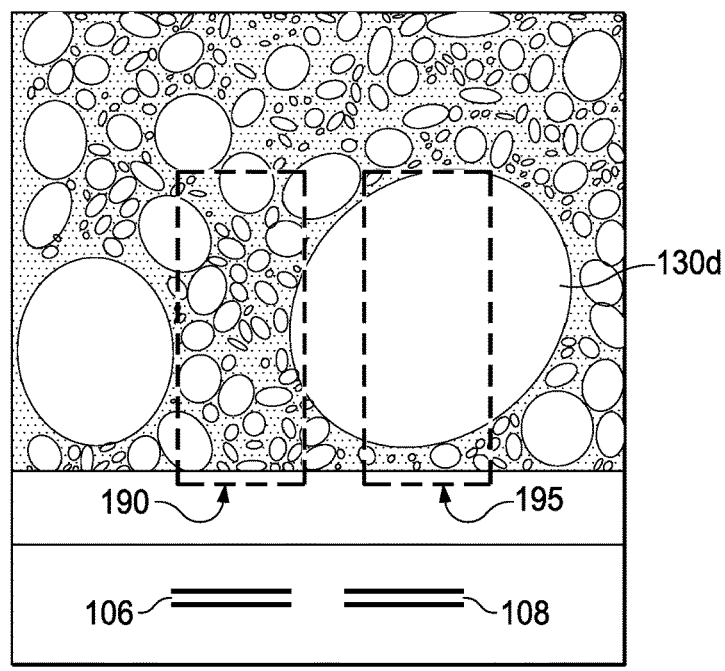
FIG. 2 illustrates a semiconductor package comprising a mold compound in which the largest size of the filler particles is larger than 50 microns.

FIG. 2 illustrates a mold compound with filler particles that have sizes larger than 50 microns. Filler particle 130d, for example, may have a size of 75 microns or larger. At that size, filler particle 130d exerts different stress on the underlying capacitor 108 than adjacent areas. The filler particles above capacitor 106 (identified generally at 190), however, are smaller than filler particle 130d in the region 195 above capacitor 108 and thus capacitor 106 may experience a different stress level with varying temperature as capacitor 108. As more resin 132 is present in the region 190 above capacitor 106 and because resin has a substantially different CTE and modulus than filler particles 130 made from silica, capacitor 106 may experience a substantially different level of stress than capacitor 108 due to variations in temperature and other stress factors.

In accordance with the disclosed embodiments, the size of the largest filler particles 130 in the mold compound 120 is between 5 microns and 50 microns. That is, no filler particle 130 larger than 50 microns are present in the mold compound in such embodiments and one or more of the filler particles 130 in the mold compound 120 has a size of at least 5 microns. Some filler particles may have sizes less than 5 microns.

In some embodiments, the size of the largest filler particles 130 is between 5 microns and 32 microns, which means that no filler particles 130 larger than 32 microns are present in the mold compound in such embodiments and one or more of the filler particles 130 in the mold compound 120 has a size of at least 5 microns. In some embodiments, the range of the maximum particle size may be 10 to 25 microns.

In accordance with the disclosed embodiments, with the largest filler particle sizes being limited as noted above (e.g., between 5 microns and 50 microns, between 5 microns and 32 microns), the largest particle size will be small enough so as not to generate large local stress variations that might otherwise be present. Thus, the regions 180 and 185 above capacitors 106 and 108 in the embodiment of FIG. 1 are more homogeneous in terms of the relative proportions of resin 132 to filler particle material. As a result, components such as capacitors 106 and 108 remain more closely matched over variations in temperature, than if particle sizes of 55 microns or larger were used in the mold compound 120. In some embodiments, a sieve is used during manufacturing to filter out filler particles larger than 50 microns (or larger than 32 microns) as filler particles are added to the resin 132.

Example I

In an example, multiple semiconductor packages 100 were fabricated, with each semiconductor including an SAR ADC with multiple nominally matching capacitors such as capacitors 106 and 108. Each semiconductor package 100 included a polyimide stress buffer layer 110 and a mold compound 120 including silica filler particles 130 in which the maximum filler particle size was less than or equal to approximately 32 microns. The mismatch in the capacitance of the capacitors was measured. The mismatch between the capacitors 106 and 108 were measured using standard techniques used in testing SAR ADCs which measure the ratio (C106−C108)/(C106+C108), where C106 and C108 are the capacitance of capacitors 106 and 108, respectively. The ratios C106/(C106+C108) and C108/(C106+C108) are nominally one-half. The measurement system makes multiple measurements of these ratios and accounts for offsets and noise in these readings to generate a sufficiently accurate measure of the ratio of (C106−C108)/(C106+C108). These measurements were also performed at different ambient temperatures to examine the variations of these ratios over the operating temperature range of the devices. The variation of this ratio over the temperature range is taken to represent the stability of the capacitance ratio. Further, the semiconductor packages 100 were fabricated with three different thicknesses for the polyimide stress buffer layer 110 (10 microns, 20 microns, and 30 microns). The reference to "1×," "2×," and "3×" refers to the 10, 20, and 30 micron thicknesses, respectively. Thus, six different types of multiple semiconductor packages were fabricated, and multiple instances of each type:

1. A semiconductor package 100 with stress buffer layer of 10 microns and a mold compound 120 with filler particles 130 having a maximum size of approximately 55 microns.
2. A semiconductor package 100 with stress buffer layer of 20 microns and a mold compound 120 with filler particles 130 having a maximum size of approximately 55 microns.
3. A semiconductor package 100 with stress buffer layer of 30 microns and a mold compound 120 with filler particles 130 having a maximum size of approximately 55 microns.
4. A semiconductor package 100 with stress buffer layer of 10 microns and a mold compound 120 with filler particles 130 having a maximum size of approximately 32 microns.
5. A semiconductor package 100 with stress buffer layer of 20 microns and a mold compound 120 with filler particles 130 having a maximum size of approximately 32 microns.
6. A semiconductor package 100 with stress buffer layer of 30 microns and a mold compound 120 with filler particles 130 having a maximum size of approximately 32 microns.

Figure 3:
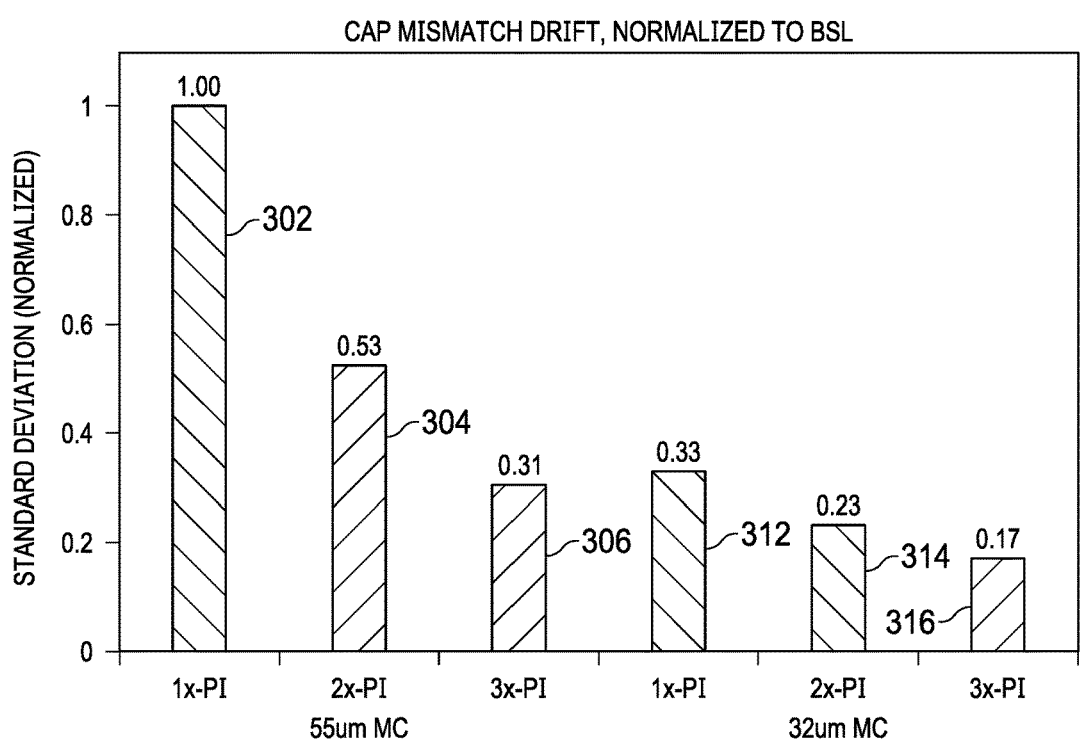
FIG. 3 shows capacitance test results between semiconductor packages using a mold compound with a maximum filler particle size of 55 microns versus a semiconductor packages using a mold compound with a maximum filler particle size of 32 microns.

FIG. 3 provides the capacitor mismatch test results. The capacitor mismatch has been normalized to the 10 micron thick stress buffer with a 55 micron filler particle maximum size. The results are given in terms of the standard deviation of the capacitor mismatch within each of the six different test runs. The standard deviation of the 10 micron thick stress buffer layer 110 with a maximum filler particle size of 55 microns is 1 as shown at 302. The standard deviation of the 20 micron thick stress buffer layer 110 with a maximum filler particle size of 55 microns is 0.53 as shown at 304. The standard deviation of the 30 micron thick stress buffer layer 110 with a maximum filler particle size of 55 microns is 0.31 as shown at 306.

Figure 4:
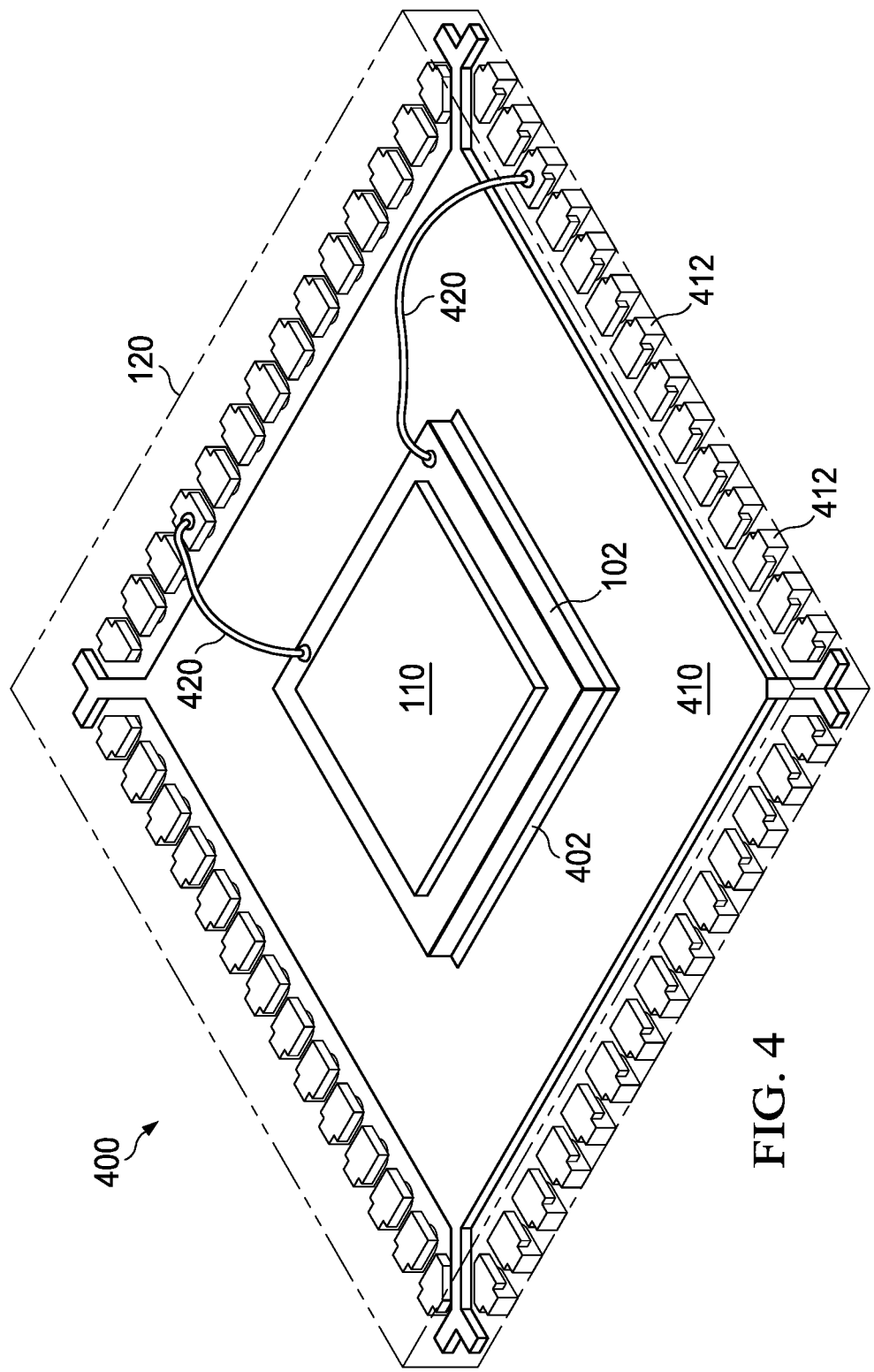
FIG. 4 shows a three-dimensional view of a semiconductor package including the disclosed mold compound.

FIG. 4 shows an example of a semiconductor package 400 including the mold compound disclosed herein. The semiconductor package 400 in this example is a quad flat no-leads (QFN) package. The semiconductor substrate 102 on which the integrated circuit is formed (the "die") is attached to a die paddle 410 by way of a thermally conductive adhesive 402 (also termed a die attach). The stress buffer layer 110 is shown formed on top of the semiconductor substrate 102. Leads 412 (which are part of a leadframe) are provided around the outer edges of the package and are electrically connected to contacts on the integrated circuit by way of wire bonds (an example of several wire bonds 420 is shown in FIG. 4). The mold compound 120 also is shown in outline covering the internal components of the package while leaving the leads 412 exposed for contact to a printed circuit board. As described above, the mold compound 120 includes filler particles that have multiple sizes with the largest of the particles having a size between, for example, 5 microns and 32 microns.

The disclosed examples are also directed to a method for forming a semiconductor package. In one example, the method includes forming an integrated circuit on a semiconductor substrate, forming a stress buffer layer on the integrated circuit, and attaching the semiconductor substrate to one or more leads. The method further includes applying a mold compound on a surface of the stress buffer layer opposite the integrated circuit. The mold compound comprises a resin, and the resin includes filler particles. The filler particles have multiple sizes with the largest of the particles having a size between 5 microns and 32 microns.

However, with the maximum filler particle size limited to 32 microns for the mold compound 120, the standard deviations dropped to 0.33 for the 10 micron thick stress buffer layer 110, 0.23 for the 20 micron thick stress buffer layer 110, and 0.17 for the 30 micron thick stress buffer layer 110. Thus, reducing the maximum filler particle size from 55 microns to 32 microns for the 10 micron thick stress buffer layer 110 resulted in a 67% reduction in the standard deviation of the capacitor mismatch (a standard deviation reduction from 1 to 0.33), which means a much smaller capacitance mismatch. Further, compared to a mold compound with a maximum filler particle size of 55 microns and a 10 micron stress buffer layer, reducing the filler particle size from 55 microns to 32 microns and increasing the thickness of the stress buffer layer from 10 to 20 microns resulted in a drop in the standard deviation of 1 to 0.23.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A semiconductor package, comprising:
   an integrated circuit formed on a semiconductor substrate;
   a stress buffer layer on and directly contacting the semiconductor substrate; and
   a mold compound on a surface of the stress buffer layer opposite the integrated circuit;
   wherein the mold compound comprises a resin, and the resin includes filler particles; and
   wherein the filler particles have multiple sizes with the largest of the particles having a size between 5 microns and 32 microns.

2. The semiconductor package of claim 1, wherein the largest of the particles has a size between 10 microns and 25 microns.

3. The semiconductor package of claim 1, wherein the integrated circuit includes an analog-to-digital converter.

4. The semiconductor package of claim 1, wherein the mold compound is on portions of the semiconductor substrate.

5. The semiconductor package of claim 1, wherein the mold comprises at least one of polyimide or a silicone-based material.

6. The semiconductor package of claim 1, wherein the stress buffer layer has a thickness that is between 1 micrometer and 50 micrometers.

7. A semiconductor package, comprising:
   an integrated circuit formed on a semiconductor substrate;
   a stress buffer layer on and directly contacting the semiconductor substrate; and
   a mold compound on a surface of the stress buffer layer opposite the integrated circuit;
   wherein the mold compound comprises a resin, and the resin includes filler particles; and
   wherein filler particles have multiple sizes with the largest of the particles having a size between 5 microns and 50 microns.

8. The semiconductor package of claim 7, wherein the largest of the particles has a size between 5 microns and 32 microns.

9. The semiconductor package of claim 7, wherein the largest of the particles has a size between 10 microns and 25 microns.

10. The semiconductor package of claim 7, wherein the integrated circuit includes at least one of an amplifier, a voltage reference, a current reference, or a sensor.

11. A semiconductor package, comprising:
    an integrated circuit on a semiconductor substrate, the integrated circuit including at least one capacitor that is sensitive to stress induced by filler particles in a mold compound;
    a stress buffer layer on and directly contacting a portion of the semiconductor substrate; and
    the mold compound over a portion of the semiconductor substrate and a portion of the stress buffer layer;
    wherein the mold compound comprises a resin, and the resin includes filler particles; and
    wherein filler particles have multiple sizes with the largest of the particles having a size between 5 microns and 50 microns.

12. The semiconductor package of claim 11, wherein the largest of the particles has a size between 5 microns and 32 microns.

13. The semiconductor package of claim 11, wherein the largest of the particles has a size between 10 microns and 25 microns.

14. The semiconductor package of claim 11, wherein the integrated circuit includes at least one of a data converter, an amplifier, a voltage reference, a current reference, or a sensor.

15. The semiconductor package of claim 11, wherein the filler particles comprise at least one of silica and alumina.

16. The semiconductor package of claim 11, wherein a first portion of the filler particles are spherical and a second portion of the filler particles have shapes that are non-geometric.

17. The semiconductor package of claim 11, further comprising a leadframe, wherein the semiconductor substrate is coupled to the leadframe and wherein the mold compound covers the leadframe.

18. A method, comprising:
    forming an integrated circuit on a semiconductor substrate;
    forming a stress buffer layer on and directly contacting the semiconductor substrate;
    attaching the semiconductor substrate to leads; and
    applying a mold compound on a surface of the stress buffer layer opposite the integrated circuit, wherein the mold compound comprises a resin, and the resin includes filler particles, and wherein the filler particles have multiple sizes with the largest of the particles having a size between 5 microns and 32 microns.

19. The method of claim 18, wherein the largest of the filler particles has a size between 10 microns and 25 microns.

\* \* \* \* \*